United States Patent
Shur et al.

(10) Patent No.: US 10,134,948 B2
(45) Date of Patent: Nov. 20, 2018

(54) LIGHT EMITTING DIODE WITH POLARIZATION CONTROL

(75) Inventors: Michael Shur, Latham, NY (US); Remigijus Gaska, Columbia, SC (US)

(73) Assignee: Sensor Electronic Technology, Inc., Columbia, SC (US)

(*) Notice: Subject to any disclaimer, the term of this patent is extended or adjusted under 35 U.S.C. 154(b) by 870 days.

(21) Appl. No.: 13/404,703

(22) Filed: Feb. 24, 2012

(65) Prior Publication Data
US 2012/0217473 A1 Aug. 30, 2012

Related U.S. Application Data

(60) Provisional application No. 61/446,516, filed on Feb. 25, 2011.

(51) Int. Cl.
| | | |
|---|---|---|
| H01L 33/06 | (2010.01) | |
| H01L 33/00 | (2010.01) | |
| H01L 33/12 | (2010.01) | |
| H01S 5/022 | (2006.01) | |
| H01S 5/042 | (2006.01) | |
| H01S 5/32 | (2006.01) | |
| H01S 5/323 | (2006.01) | |

(52) U.S. Cl.
CPC ............ *H01L 33/06* (2013.01); *H01L 33/007* (2013.01); *H01L 33/12* (2013.01); *H01S 5/0224* (2013.01); *H01S 5/0422* (2013.01); *H01S 5/3201* (2013.01); *H01S 5/32341* (2013.01)

(58) Field of Classification Search
CPC ........ H01L 33/007; H01L 33/06; H01L 33/12
USPC .......................................................... 257/13
See application file for complete search history.

(56) References Cited

U.S. PATENT DOCUMENTS

| | | | |
|---|---|---|---|
| 5,521,742 A | 5/1996 | Ishimura | |
| 5,686,734 A | 11/1997 | Hamakawa et al. | |
| 5,991,321 A * | 11/1999 | Duggan ................... | H01S 5/20 372/45.01 |
| 6,452,206 B1 * | 9/2002 | Harman et al. ................. | 257/22 |
| 6,515,313 B1 | 2/2003 | Ibbetson et al. | |
| 7,326,923 B2 | 2/2008 | Berstis | |
| 7,326,963 B2 * | 2/2008 | Gaska et al. .................... | 257/79 |

(Continued)

FOREIGN PATENT DOCUMENTS

| | | |
|---|---|---|
| JP | 2000223790 A | 8/2000 |
| JP | 2000277868 | 10/2000 |

(Continued)

OTHER PUBLICATIONS

Office Action for Japanese Application No. 2013-555630 with machine-generated English translation, dated Oct. 23, 2014, 4 pages.

(Continued)

*Primary Examiner* — Joseph Galvin, III
(74) *Attorney, Agent, or Firm* — LaBatt, LLC

(57) ABSTRACT

An improved light emitting heterostructure is provided. The heterostructure includes an active region having a set of barrier layers and a set of quantum wells, each of which is adjoined by a barrier layer. The quantum wells have a delta doped p-type sub-layer located therein, which results in a change of the band structure of the quantum well. The change can reduce the effects of polarization in the quantum wells, which can provide improved light emission from the active region.

16 Claims, 4 Drawing Sheets

(56) References Cited

U.S. PATENT DOCUMENTS

| | | | |
|---|---|---|---|
| 7,619,238 B2 | 11/2009 | Gaska et al. | |
| 7,791,062 B2* | 9/2010 | Lee | 257/13 |
| 8,536,615 B1* | 9/2013 | Driscoll et al. | 257/101 |
| 2002/0008242 A1* | 1/2002 | Hata | B82Y 20/00 257/79 |
| 2003/0020085 A1 | 1/2003 | Bour et al. | |
| 2003/0132431 A1* | 7/2003 | Hanamaki | B82Y 20/00 257/14 |
| 2003/0197188 A1 | 10/2003 | Watatani et al. | |
| 2006/0118820 A1* | 6/2006 | Gaska | B82Y 20/00 257/189 |
| 2007/0181869 A1* | 8/2007 | Gaska | H01L 33/06 257/14 |
| 2008/0081390 A1 | 4/2008 | Gaska et al. | |
| 2008/0230766 A1 | 9/2008 | Okamoto et al. | |
| 2008/0296556 A1* | 12/2008 | De Souza | H01L 22/20 257/15 |
| 2008/0315179 A1* | 12/2008 | Kim | H01L 33/06 257/13 |
| 2009/0057691 A1* | 3/2009 | Kim | H01L 33/06 257/89 |
| 2009/0090900 A1* | 4/2009 | Avramescu et al. | 257/13 |
| 2009/0090929 A1* | 4/2009 | Tu | H01L 27/156 257/102 |
| 2009/0166606 A1 | 7/2009 | Lee | |
| 2011/0027973 A1* | 2/2011 | Su | C23C 16/481 438/478 |

FOREIGN PATENT DOCUMENTS

| | | |
|---|---|---|
| JP | 2001251022 A | 9/2001 |
| JP | 2003023220 A | 1/2003 |
| JP | 2003060232 A | 2/2003 |
| JP | 2003218454 A | 7/2003 |
| KR | 20060060316 A | 6/2006 |
| KR | 20080022464 A | 3/2008 |
| KR | 10-2009-0054813 | 6/2009 |
| KR | 10-2010-0066767 | 6/2010 |
| TW | I334653 | 12/2010 |
| WO | 2006062880 A3 | 6/2006 |

OTHER PUBLICATIONS

Park, International Application No. PCT/US2012/026669, International Search Report and the Written Opinion of the International Searching Authority, SETI-0069-PCT, dated Jul. 10, 2012, 8 pages.

Hang et al., AlxGa1-xN/GaN band offsets determined by deep-level emission, Journal of Applied Physics, vol. 90, No. 4, Aug. 15, 2001, pp. 1887-1890.

Kozodoy et al., "Enhanced Mg Doping Efficiency in Al(0.2)Ga(0.8)N/GaN Superlattices", Applied Physics Letters, vol. 74, No. 24, pp. 3681-3683, Jun. 14, 1999.

Kozodoy et al., "Polarization-enhanced Mg Doping of AlGaN/GaN Superlattices", Applied Physics Letters, vol. 75, No. 16, pp. 2444-2446, Oct. 18, 1999.

Nakano et al., "Electrical Properties of Acceptor Levels in Mg-Doped GaN", Phys. Stat. Sol. (c) 0, No. 1, pp. 438-442, Copyright 2002.

Saxler et al., "Aluminum Gallium Nitride Short-Period Superlattices Doped with Magnesium", Applied Physics Letters, vol. 74, No. 14, pp. 2023-2025, Apr. 5, 1999.

Schubert et al., "Enhancement of Deep Acceptor Activation in Semiconductors by Superlattice Doping", Applied Physics Letters, vol. 69, No. 24, pp. 3737-3739, Dec. 9, 1996.

Shur et al., "Accumulation Hole Layer in p-GaN/AlGaN Heterostructures", Applied Physics Letters, vol. 76, No. 21, pp. 3061-3063, May 22, 2000.

Korean Intellectual Property Office, Application No. 10-2013-7025240 (SETI-0069-KR), "Decision of Refusal," with English translation, dated Jul. 2, 2015, 6 pages.

Albrecht, C., European Application No. EP 12749471, Supplementary European Search Report, Nov. 17, 2015, 8 pages.

Yuanyuan, C., Chinese Application No. 201280010124.7, Office Action 1 with English translation, dated Oct. 23, 2015, 17 pages.

Korean Intellectual Property Office, Application No. 10-2013-7025240, "Decision of Refusal," with English translation, dated Mar. 23, 2015, 3 pages.

Application No. 2013555630, "Decision of Refusal," with English translation, dated Apr. 28, 2015, 4 pages.

Yuanyuan, C., Chinese Application No. 201280010124.7, Office Action 2 with English translation, dated Jun. 8, 2016, 6 pages.

Yuanyuan, C., Chinese Application No. 201280010124.7, Notice of Allowance (An English translation is not available), dated Jan. 13, 2017, 2 pages.

Japanese Application No. 2013-555630, Notice of Allowance (An English translation is not available), dated Oct. 27, 2015, 3 pages.

Korean Intellectual Property Office, Application No. 10-2013-7025240, Notice of Allowance (An English translation is not available), dated Jul. 2, 2015, 2 pages.

Office Action for Korean Application No. 10-2013-7025240 with English translation, Sep. 4, 2014, 12 pages.

* cited by examiner

LIGHT EMITTING DIODE WITH POLARIZATION CONTROL

REFERENCE TO RELATED APPLICATIONS

The current application claims the benefit of U.S. Provisional Application No. 61/446,516, titled "Light Emitting Diode with Polarization Control", which was filed on 25 Feb. 2011, and which is hereby incorporated by reference.

TECHNICAL FIELD

The disclosure relates generally to light emitting diodes, and more particularly, to a light emitting diode with polarization control.

BACKGROUND ART

A great deal of interest has been focused on nitride-based light emitting diodes and lasers that emit light in the blue and deep ultraviolet (UV) wavelengths. These devices may be capable of being incorporated into various applications, including solid-state lighting, biochemical detection, high-density data storage, and the like. However, to date, the performance of nitride-based light emitting diodes and lasers quickly worsens as the radiation wavelength is reduced into the ultraviolet range.

A modern light emitting diode (LED) consists of three major components: an electron supply layer (e.g., an n-type semiconductor) and a hole supply layer (e.g., a p-type semiconductor), with a light generating structure between them. The relatively poor efficiency with which light generated by the light generating structure is a significant barrier to improving the performance of the device in generating light having the shorter wavelengths. Such efficiency is limited by a large difference between the mobilities of electrons and holes. Since electrons are more mobile than holes, the electrons travel more quickly than holes.

To address this situation, some approaches incorporate an electron blocking layer between the light generating structure and a p-type contact layer. The electron blocking layer slows down electrons and allows for a more efficient radiative recombination. However, the electron blocking layer also increases the series resistance of the device and, to a certain extent, provides a barrier for holes as well. Many approaches incorporate multiple quantum wells into the light generating structure to increase the concentration of electron-hole pairs. However, these approaches still fail to provide a solution that efficiently generates light in the shorter wavelengths. Since an amount of nonradiative recombination of electrons and holes is determined by dislocations, many approaches seek to improve the quality of the materials used in the device. Nevertheless, the efficiency of deep UV LEDs remains low.

Another difficulty in developing a UV LED is a deficient hole injection. To date, Magnesium (Mg) is the most successful acceptor, and is therefore commonly used for p-type Gallium (Ga) Nitride (N) layers. The room-temperature activation energy for such a layer can be as high as two-hundred fifty milli-electron Volts (meV), and increases roughly linearly with the Aluminum (Al) molar fraction in AlGaN alloys. However, a large acceptor activation energy results in a deficient hole injection. This is particularly true for a deeper UV LED, in which a higher Al molar fraction is required.

Various approaches seek to enhance the conductivity for a p-type Mg-doped AlGaN layer. In one approach, a Mg-doped AlGaN/GaN short period superlattice (SPSL), such as a Mg-doped AlGaN/GaN SPSL in 340-350 nm UV LED growth, has been used in place of the layer. In this case, a period of the superlattice is sufficiently small (e.g., below four nanometers) so that the effect of the polarization fields on the minibands in the SPSL is negligible. As a result, a vertical conduction of the p-type SPSL is not degraded by the polarization fields.

Another approach uses a Mg-doped AlGaN/GaN large period superlattice (LPSL). In this case, with a period larger than fifteen nm, a valence band discontinuity and the polarization fields can enhance the ionization of the acceptors in the AlGaN barriers and transfer holes into GaN wells. However, the large period inhibits the wavefunction coupling between neighboring wells, which greatly reduces the vertical conductivity. As a result, this LPSL approach can only enhance lateral horizontal p-conductivity. To date, no known approach has successfully used a p-type LPSL for a deep UV LED.

Yet another approach uses a p-GaN/p-AlGaN single heterostructure to accumulate holes at the interface. The mechanism of this approach is similar to the LPSL approach. However, since the p-GaN/p-AlGaN single heterostructure only includes one barrier for hole transportation, the vertical conductivity can be greatly enhanced due to the high-density hole accumulation at the interface, field assisted tunneling, and thermal emission. Several UV LEDs have been proposed that incorporate this approach, and have achieved reasonably good output powers. However, it remains desirable to improve the output power and/or efficiency of UV LEDs.

SUMMARY OF THE INVENTION

Aspects of the invention provide an improved light emitting heterostructure. The heterostructure includes an active region having a set of barrier layers and a set of quantum wells, each of which is adjoined by a barrier layer. The quantum wells have a delta doped p-type sub-layer located therein, which results in a change of the band structure of the quantum well.

A first aspect of the invention provides a nitride-based light emitting heterostructure comprising: an electron supply layer; a hole supply layer; and an active region located between the electron supply layer and the hole supply layer, the active region including: a set of barrier layers; and a set of quantum wells, each quantum well adjoined by a barrier layer and having a delta doped p-type sub-layer located therein.

A second aspect of the invention provides a light emitting heterostructure comprising: an active region including: a set of barrier layers; and a set of quantum wells, each quantum well adjoined by a barrier layer and having a delta doped p-type sub-layer located therein.

A third aspect of the invention provides a method of manufacturing a nitride-based light emitting heterostructure, the method comprising: forming an active region including: a set of barrier layers; and a set of quantum wells, each quantum well adjoined by a barrier layer and having a delta doped p-type sub-layer located therein.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide an improved light emitting heterostructure. The heterostructure includes an active region having a set of barrier layers and a set of quantum wells, each of which is adjoined by a barrier layer. The quantum wells have a delta doped p-type sublayer located therein, which results in a change of the band structure of the quantum well. The change can reduce the effects of polarization in the quantum wells, which can provide improved light emission from the active region. As used herein, unless otherwise noted, the term "set" means one or more (i.e., at least one) and the phrase "any solution" means any now known or later developed solution.

Figure 1:
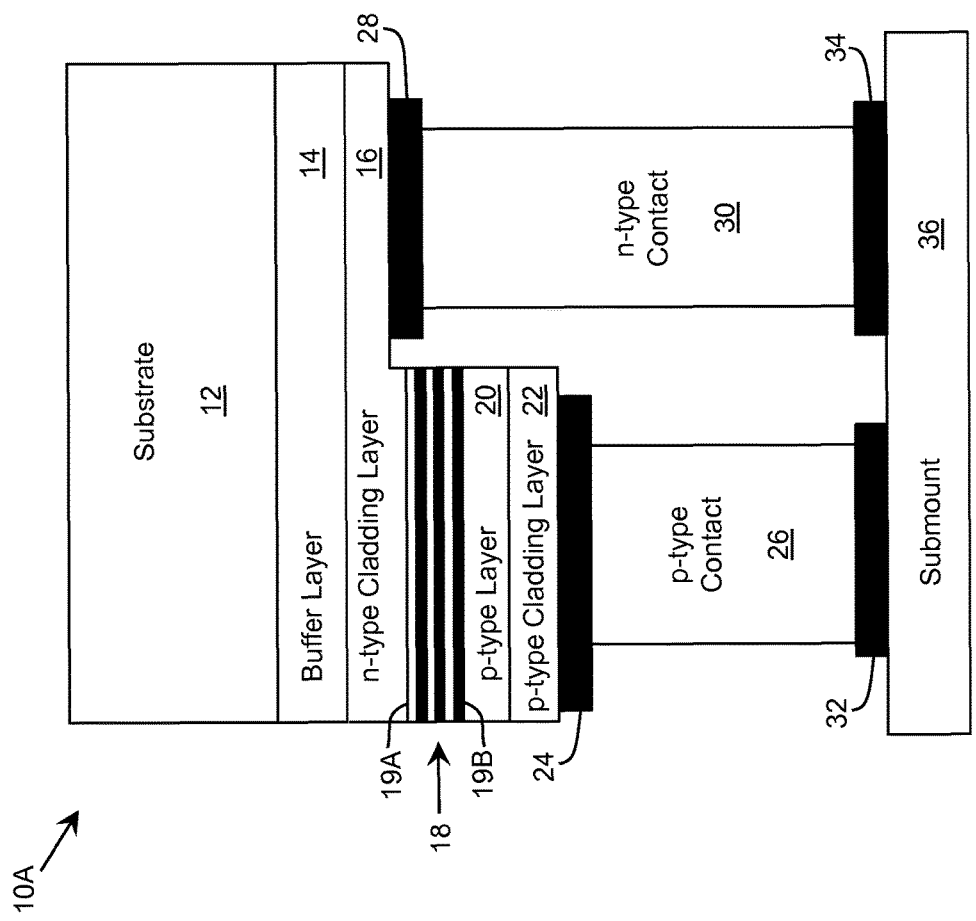
FIG. 1 shows a schematic structure of an illustrative emitting device according to an embodiment.

Turning to the drawings, FIG. 1 shows a schematic structure of an illustrative emitting device 10A according to an embodiment. In an embodiment, the emitting device 10A is configured to operate as a light emitting diode (LED). Alternatively, the emitting device 10A can be configured to operate as a laser diode (LD). In either case, during operation of the emitting device 10A, application of a bias comparable to the band gap results in the emission of electromagnetic radiation from an active region 18 of the emitting device 10A. The electromagnetic radiation emitted by the emitting device 10A can comprise a peak wavelength within any range of wavelengths, including visible light, ultraviolet radiation, deep ultraviolet radiation, infrared light, and/or the like.

The emitting device 10A includes a substrate 12, a buffer layer 14 adjacent to the substrate 12, an n-type cladding layer 16 adjacent to the buffer layer 14, and an active region 18 having an n-type side 19A adjacent to the n-type cladding layer 16. Furthermore, the emitting device 10A includes a p-type layer 20 adjacent to a p-type side 19B of the active region 18 and a p-type cladding layer 22 adjacent to the p-type layer 20.

In a more particular illustrative embodiment, the emitting device 10A is a group III-V materials based device, in which some or all of the various layers are formed of elements selected from the group III-V materials system. In a still more particular illustrative embodiment, the various layers of the emitting device 10A are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10A includes an active region 18 composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

As shown with respect to the emitting device 10A, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, p-type metal 24 and n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by an active region described herein (e.g., peak emission wavelength +/− five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10A, the device 10A can be mounted to a submount 36 via contacts 26, 30. In this case, the substrate 12 is located on the top of the emitting device 10A. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10A can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

Figure 2:
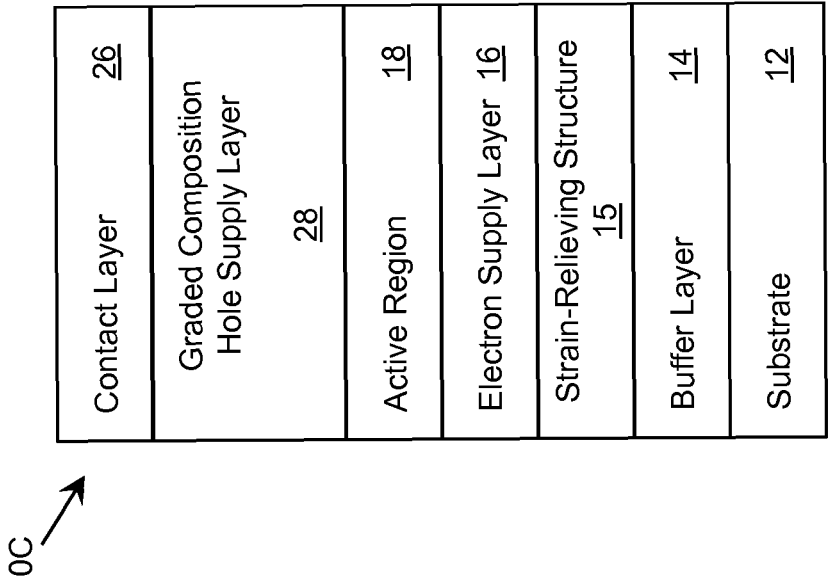
FIG. 2 shows an illustrative light emitting heterostructure according to another embodiment.

FIG. 2 shows an illustrative light emitting heterostructure 10B according to another embodiment. The heterostructure 10B is shown including a substrate 12, a buffer layer 14 adjacent to the substrate 12, and a strain-relieving structure 15 on the buffer layer 14. The heterostructure 10B also includes an electron supply layer 16, a hole supply layer 22, and an active region 18 located between the electron supply layer 16 and the hole supply layer 22. The heterostructure 10B also is shown including an electron blocking layer 20 located between the active region 18 and the hole supply layer 22, and a contact layer 26.

Each of the layers in the heterostructure 10B can be configured similar to the corresponding layers described with reference to the device 10A (FIG. 1). The strain-relieving structure 15 can be included and configured to provide improved materials quality for the heterostructure 10B. To this extent, the strain-relieving structure 15 can comprise any type of strain-relieving structure, such as a superlattice (e.g., a long period superlattice, a short period superlattice, a short or long period superlattice comprising graded composition and/or a variable composition from period to period), multiple quantum wells with wide barriers, a single quantum well, a multi-layered structure (e.g., hundreds of Angstroms thick, no confinement) with abrupt or graded heterointerfaces, and/or the like. The strain-relieving structure 15 can comprise any composition, such as AlN/GaN, AlN/AlGaN, AlGaN/AlGaN, AlInGaN/AlInGaN, or the like.

The electron supply layer 16 and the hole supply layer 22 also can comprise any type of electron/hole supply layers. For example, the electron supply layer 16 can comprise an n-type semiconductor, such as an n-type contact layer or an n-type cladding layer. Similarly, the hole supply layer 22 can comprise a p-type semiconductor, such as a p-type contact layer or a p-type cladding layer. Additionally, the hole supply layer 22 could comprise a multi-layer structure, such as a Mg-doped AlGaN/GaN or AlGaInN/AlInGaN short period superlattice. Each supply layer 16, 22 can comprise, for example, a group III nitride formed of nitrogen with one or more of Ga, Al, or In. In one embodiment, the electron supply layer 16 comprises an n-type AlGaN cladding layer, and the hole supply layer 22 comprises a p-type Mg-doped AlGaN cladding layer. Alternatively, the hole supply layer 22 could be doped with manganese (Mn), beryllium (Be), a Mg co-dopant, such as Mg+O, Mg+Si, and/or the like.

In an embodiment, the hole supply layer 22 comprises a heterostructure or superlattice including a set of quantum wells and a set of barriers. In this case, a target band discontinuity for the quantum wells and barriers in the hole supply layer 22 can be selected to coincide (e.g., align or substantially align) with the activation energy of a dopant for the quantum well. For example, a target valence band discontinuity can be selected such that the acceptor level in the barrier coincides with a valence energy band edge for the adjacent quantum well. In a more specific illustrative embodiment, the target valence band discontinuity for the quantum well and the dopant energy levels are within (i.e., less than or equal to) approximately three thermal energies (i.e., within a thermal energy of 3 kT≈0.078 eV at room temperature).

The electron blocking layer 20 can comprise any type of electron blocking layer, such as a p-type AlGaN layer. In one embodiment, the electron blocking layer 20 comprises a graded composition that provides a gradual transition from a composition for the hole supply layer 22 to a composition for the electron blocking layer 20 as the electron blocking layer 20 moves closer to the active region 18. For example, the electron blocking layer 20 can comprise an AlGaN composition having a thickness of approximately 500 Angstroms, in which the Al composition is gradually decreased (e.g., approximately linearly) from approximately sixty percent to five percent as the electron blocking layer 20 moves closer to the active region 18. It is understood that this is only illustrative of various alternatives. For example, depending on the growth conditions, the fraction of Al in the electron blocking layer 20 can either increase or decrease as the electron blocking layer 20 moves closer to active region 18. Additionally, the content of Al can vary between approximately 100% and approximately 0.1%.

Figure 3:
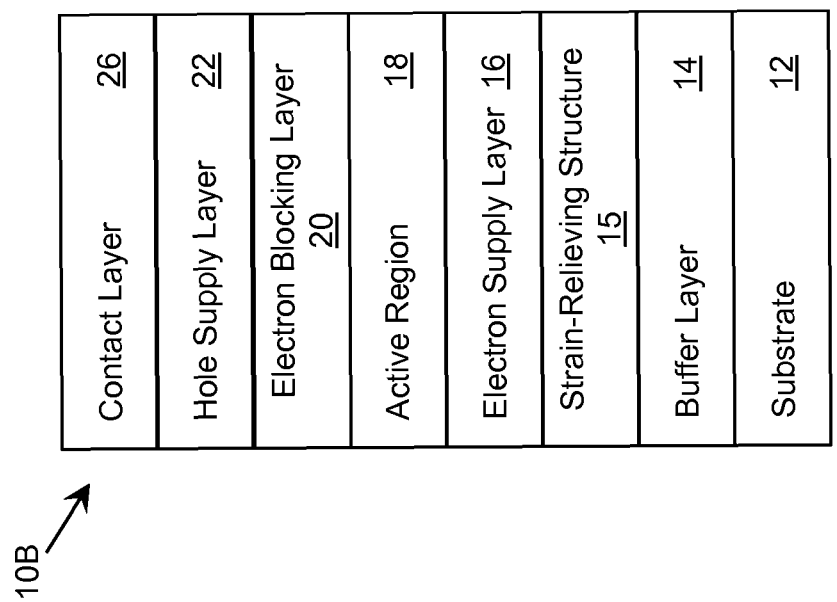
FIG. 3 shows an illustrative light emitting heterostructure according to still another embodiment.

FIG. 3 shows an illustrative light emitting heterostructure 100 according to still another embodiment, in which the hole supply layer 22 and the electron blocking layer 20 of the heterostructure 10B of FIG. 2 are replaced with a graded composition hole supply layer 28. The graded composition hole supply layer 28 can comprise a graded composition that transitions from a hole supply layer composition (e.g., a p-type AlGaN or AlGaInM composition) adjacent to the contact layer 26 to an electron blocking layer composition (e.g., a p-type AlGaN composition) as the hole supply layer 28 moves closer to the active region 18. In an embodiment, an amount of Al and/or In in the hole supply layer 28 can be increased/decreased (e.g., approximately linearly) over the width of the hole supply layer 28. For example, the hole supply layer 28 can comprise a thickness of approximately 100 nanometers in which an Al composition increases from approximately 0.1% to approximately 70%.

It is understood that the layer configurations of the emitting device 10A and heterostructures 10B, 100 described herein are only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the hole supply layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the hole supply layer 22 and the active region 18.

Similarly, a device/heterostructure can include a p-type layer located between the hole supply layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the hole supply layer 22) or can include only one of the DBR structure or the p-type layer. In an embodiment, the p-type layer can be included in the device/heterostructure in place of the electron blocking layer 20 (FIG. 2). In another embodiment, the p-type layer can be included between the hole supply layer 22 and the electron blocking layer 20.

The heterostructures/devices described herein can include one or more layers outside of the active region 18, which have graded compositions configured to improve an efficiency with which the electrons and holes recombine in the active region 18 (e.g., the quantum wells therein). In an embodiment, a graded composition causes electrons to lose energy prior to entering a quantum well in the active region 18. For example, an electron supply barrier layer can be located between the electron supply layer 16 and the active region 18, and can have a graded composition that creates a band structure profile such that electrons entering the active region 18 have an energy that is approximately the same as an energy of a polar optical phonon. Similarly, a hole supply barrier layer can be located between the hole supply layer 22 and the active region 18, and can have a graded composition that creates a band structure profile such that holes entering the active region 18 have an energy that is approximately the same as an energy of a polar optical phonon. In this manner, the heterostructure/device can form a potential well within which the active region 18 is located. The hole supply barrier layer can be located between the hole supply layer 22 and the electron blocking layer 20, when present. In this case, the composition difference between the active region 18 and the electron blocking layer 20 can be tuned to ensure that the holes only see a potential difference of a polar optical phonon.

In an embodiment, a graded layer described herein can be a superlattice layer. Furthermore, the superlattice layer can be configured, for example, to reduce strain between the materials of the adjacent layers. For example, the superlattice layer can have multiple sub-layers, where two adjacent sub-layers have strains of opposite signs. In an embodiment, the materials and/or growth conditions of adjacent sub-layers can be changed such that one sub-layer is under tension while the adjacent sub-layer is under compression. In this case, the two adjacent sub-layers can have strain-induced polarization fields of opposite signs. In an embodiment, the relative magnitudes of the respective strains can be configured to be substantially equal.

In each of the heterostructures/devices described herein, the active region 18 can be formed of a set of quantum wells and a set of barriers alternating with the quantum wells. In general, the quantum wells and barrier layers can be alternated such that each quantum well is adjoined by at least one barrier layer. It is understood that any number of quantum wells and barrier layers can be included in the active region 18, including a single quantum well and barrier layer. Each quantum well can comprise any composition, such as AlGaN, AlGaInM, and/or the like.

Each barrier layer in the active region 18 can comprise a graded composition. The graded composition of each barrier layer, as well as the electron blocking layer 20 (FIG. 2), and/or the graded composition hole supply layer 28 (FIG. 3) can be configured to cause electrons to lose energy prior to entering a quantum well. In general, a high Al content layer comprises a barrier for electrons and holes. To prevent electron penetration into p-type material, a high Al content layer is used as electron blocking layer 20. However, this will also provide a barrier to holes as they move to the light generating region. In an embodiment, each barrier layer, electron blocking layer 20, and/or graded composition hole supply layer 28 can comprise a ternary or quaternary composition, such as AlGaN, AlGaInM, and/or the like. In one embodiment, each barrier layer comprises ternary or quaternary Al graded composition.

Figure 4:
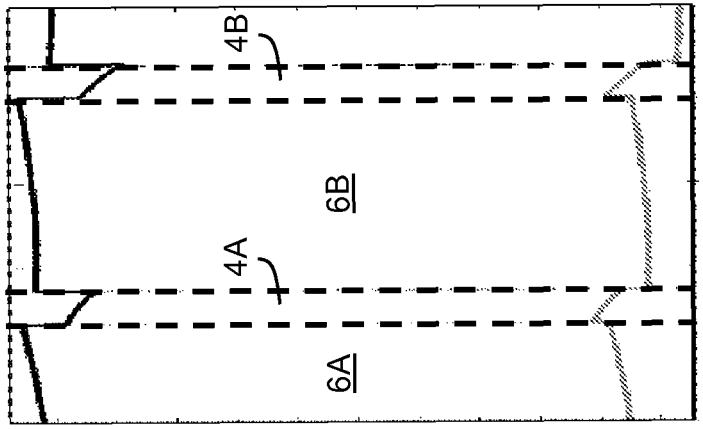
FIG. 4 shows a simulated band diagram of a portion of an active region according to the prior art.
Figure 6:
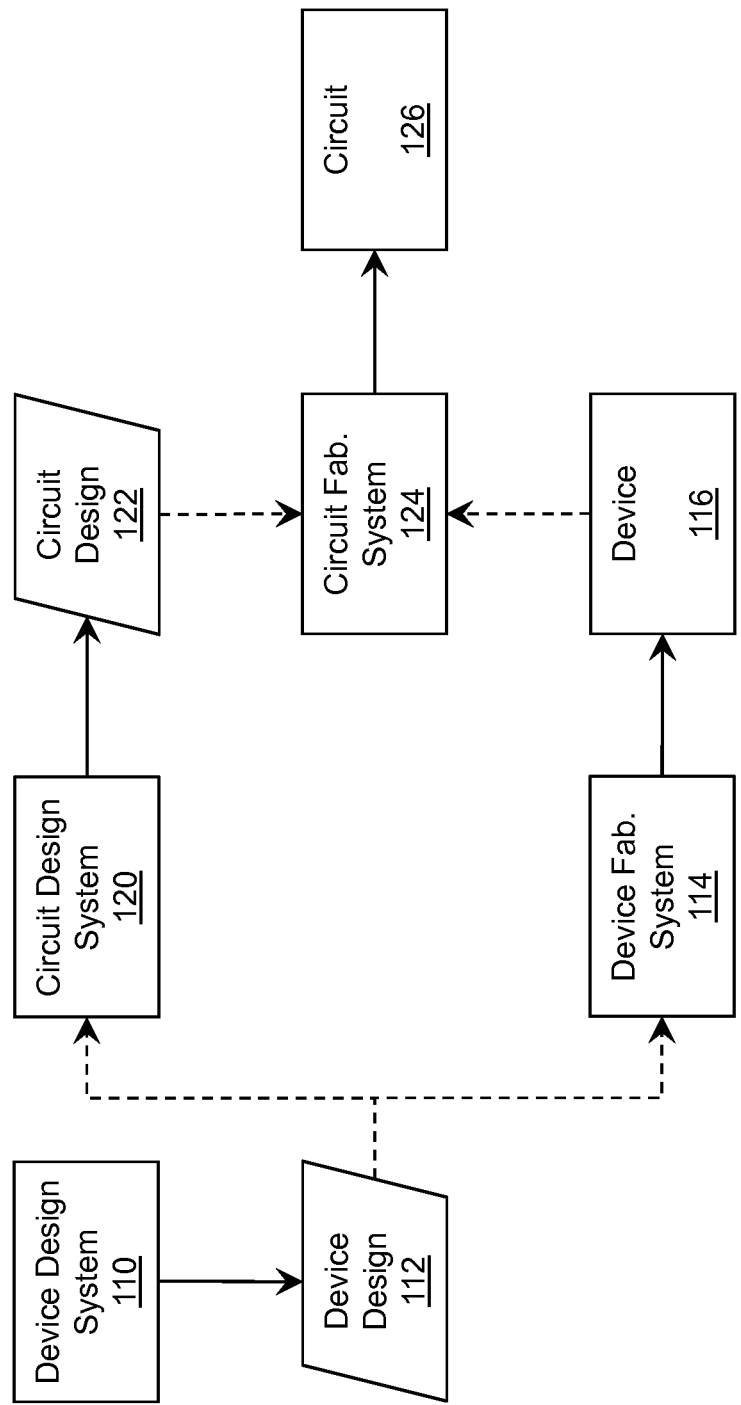
FIG. 6 shows an illustrative flow diagram for fabricating a circuit according to an embodiment.

In an embodiment, one or more quantum wells in the active region 18 can include a delta doped p-type layer therein. In this case, the delta doped p-type layer can change a band structure of the quantum well to, for example, reduce the polarization effects within the quantum well. For example, FIG. 4 shows a simulated band diagram of a portion of an active region 2 according to the prior art. In particular, the active region 2 comprises an AlGaN structure including a plurality of quantum wells 4A, 4B separated by a plurality of barriers 6A, 6B. As illustrated, polarization effects can cause the band diagram for the quantum wells 4A, 4B to bend (e.g., as illustrated by tilt in the band diagram), thereby reducing the overlap of the electron and hole wave functions, resulting in less efficient light emission from the active region 2.

Figure 5:
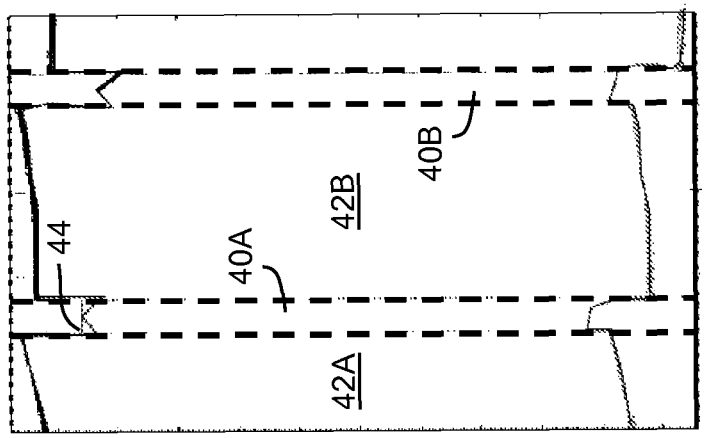
FIG. 5 shows an illustrative band diagram of a portion of an active region according to an embodiment.

In contrast, FIG. 5 shows an illustrative band diagram of a portion of an active region 18 according to an embodiment. In this case, the active region 18 includes a plurality of quantum wells 40A, 40B separated by a plurality of barriers 42A, 42B. However, each quantum well 40A, 40B includes a delta doped p-type sub-layer therein. In the resulting band structure of the quantum wells 40A, 40B, the polarization effects are reduced and the electron ground state 44 is located above the band bending range of energies caused by the polarization effects (e.g., the range of energies within which the tilt is located). In this manner, the delta doped p-type sub-layer can provide improved light emission from the active region 18 as opposed to the active region 2.

In an embodiment, the delta doped p-type sub-layer is included in one or more quantum wells 40A, 40B of an active region 18 in which the band diagram is affected (e.g., tilted) by polarization. For example, the active region 18 can have wurtzite crystal symmetry. To this extent, the active region 18 can be formed of group III nitride based materials. The delta doped p-type sub-layer can be inserted in the quantum wells 40A, 40B using any solution. For example, after growing a portion of a quantum well 40A, 40B, a thin layer (e.g., an atomic layer) of an acceptor, such as Mg, can be added while no other species are added. Subsequently, the remainder of the quantum well 40A, 40B can be grown. The delta doped p-type sub-layer can be located within a central portion of a quantum well 40A, 40B, or closer to the side of the quantum well 40A, 40B on which polarization will cause the lowest energy level.

Additional features, such as a thickness (width) of each quantum well in the active region 18, can be selected/incorporated into the active region 18 to provide one or more desired operating characteristics. For example, each quantum well can comprise a thickness that is less than a characteristic radius of one or more defects responsible for nonradiative recombination of electrons and holes in quantum well. In one embodiment, each quantum well comprises a thickness of approximately two nanometers, which is thinner than the dimension of defects such as dislocation, deep impurity, and/or the like. To this extent, a thickness of the quantum well can be smaller than a nonradiative recombination center radius.

Furthermore, a thickness of each quantum well can be selected such that an electron ground state of each quantum well is above a band bending range of energies caused by one or more polarization effects. To this extent, a thickness of each quantum well can generally be in the approximately two to five nanometer range, but in certain cases could be up to approximately ten nanometers. In this case, the electron ground state is in the region of energies for which the polarization field has little or no effect, which can increase the overlap of the electron and hole wave functions, resulting in more efficient light emission. Even further, a thickness of each quantum well can be selected to ensure that an electron ground state of each quantum well comprises a higher energy than a highest energy of the bottom of a conduction band in the same quantum well. In this case, the electron wavefunction will occupy the entire quantum well, thereby providing a stronger overlap with the hole wavefunction.

It is understood that an emitting device/heterostructure can be manufactured using any solution. For example, an emitting device/heterostructure can be manufactured by obtaining (e.g., forming, preparing, acquiring, and/or the like) a substrate 12, forming (e.g., growing, depositing, adhering, and/or the like) a buffer layer 14 thereon, and forming an electron supply layer 16 over the buffer layer 14. Furthermore, the active region 18, including the quantum wells and barriers as described herein, can be formed over the electron supply layer 16 using any solution. The electron blocking layer 20 can be formed over the active region 18 and the hole supply layer 22 can be formed on the electron blocking layer 20 using any solution. Additionally, one or more metal layers, contacts, and/or additional layers can be formed as described herein. Furthermore, the heterostructure/device can be attached to a submount via contact pads. It is understood that the manufacture of the emitting device/heterostructure can include the deposition and removal of a temporary layer, such as mask layer, the patterning one or more layers, the formation of one or more additional layers not shown, and/or the like.

While shown and described herein as a method of designing and/or fabricating an emitting device, it is understood that aspects of the invention further provide various alternative embodiments. For example, in one embodiment, the invention provides a method of designing and/or fabricating a circuit that includes one or more of the emitting devices designed and fabricated as described herein.

To this extent, FIG. 7 shows an illustrative flow diagram for fabricating a circuit 126 according to an embodiment. Initially, a user can utilize a device design system 110 to generate a device design 112 for an emitting device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A nitride-based light emitting heterostructure comprising:
   an electron supply layer;
   a hole supply layer; and
   an active region located between the electron supply layer and the hole supply layer, the active region including:
   a set of barrier layers having strain-induced polarization fields of a first sign; and
   a set of quantum wells having strain-induced polarization fields of a second sign opposite the first sign, each quantum well adjoined by a barrier layer in the set of barrier layers, wherein each quantum well has a delta doped p-type sub-layer located in a central portion thereof, wherein the delta doped p-type sub-layer causes an electron ground state in each quantum well to be located above a band bending range of energies caused by polarization effects.

2. The heterostructure of claim 1, wherein each quantum well further has a thickness less than a characteristic radius of a defect responsible for nonradiative recombination for the nitride-based light emitting heterostructure.

3. The heterostructure of claim 1, wherein the active region has wurtzite crystal symmetry.

4. The heterostructure of claim 1, further comprising an electron blocking layer located between the active region and the hole supply layer, wherein the electron blocking layer comprises a graded composition including a plurality of sub-layers forming a first side of a potential well within which the active region is located, and wherein adjacent sub-layers in the plurality of sub-layers have strains of opposite signs.

5. The heterostructure of claim 1, further comprising an electron supply barrier layer located between the active region and the electron supply layer, wherein the electron supply barrier layer has a graded composition forming a first side of a potential well within which the active region is located.

6. The heterostructure of claim 5, wherein the electron supply barrier layer creates a band structure profile such that electrons entering the active region have energies approximately the same as an energy of a polar optical phonon.

7. The heterostructure of claim 1, wherein the hole supply layer comprises a p-type cladding layer including:
   a second set of quantum wells; and
   a second set of barriers, wherein a band discontinuity between a quantum well in the second set of quantum wells and an adjacent barrier in the second set of barriers coincides with an activation energy of a dopant in the quantum well in the second set of quantum wells.

8. A light emitting heterostructure comprising:
   a set of large band gap layers having strain-induced polarization fields of a first sign; and
   a set of small band gap layers having strain-induced polarization fields of a second sign opposite the first sign, each small band gap layer adjoined by at least one large band gap layer, wherein each small band gap layer has a delta doped p-type sub-layer located in a central portion thereof, wherein each small band gap layer has a band gap smaller than a band gap of each of the at least one adjoining large band gap layer, wherein the delta doped p-type sub-layer causes an electron ground state in each small band gap layer to be located above a band bending range of energies caused by polarization effects.

9. The heterostructure of claim 8, wherein the set of large band gap layers and the set of small band gap layers form an active region for the heterostructure, the heterostructure further comprising:
   a hole supply layer; and
   an electron blocking layer located between the active region and the hole supply layer, wherein the electron blocking layer comprises a graded composition including a plurality of sub-layers forming a first side of a potential well within which the active region is located, and wherein adjacent sub-layers in the plurality of sub-layers have strains of opposite signs.

10. The heterostructure of claim 8, wherein the set of large band gap layers and the set of small band gap layers are each formed of group III nitride based materials.

11. The heterostructure of claim 10, wherein each small band gap layer further has a thickness less than a characteristic radius of a defect responsible for nonradiative recombination.

12. The heterostructure of claim 8, wherein the set of large band gap layers are undoped.

13. The heterostructure of claim 8, wherein a thickness of each small band gap layer is such that an electron ground state of each small band gap layer is a higher energy than a bottom of a conduction band in the small band gap layer.

14. The heterostructure of claim 8, wherein each large band gap layer comprises a graded composition.

15. The heterostructure of claim 1, wherein the delta doped p-type sub-layer is an atomic layer.

16. The heterostructure of claim 1, wherein the set of quantum wells are formed of aluminum gallium nitride.

* * * * *